US010700072B2

(12) United States Patent
Panda et al.

(10) Patent No.: US 10,700,072 B2
(45) Date of Patent: Jun. 30, 2020

(54) CAP LAYER FOR BIT LINE RESISTANCE REDUCTION

(71) Applicant: Applied Materials, Inc., Santa Clara, CA (US)

(72) Inventors: Priyadarshi Panda, Newark, CA (US); Jianxin Lei, Fremont, CA (US); Wenting Hou, San Jose, CA (US); Mihaela Balseanu, Sunnyvale, CA (US); Ning Li, San Jose, CA (US); Sanjay Natarajan, Portland, OR (US); Gill Yong Lee, San Jose, CA (US); In Seok Hwang, Pleasanton, CA (US); Nobuyuki Sasaki, Santa Clara, CA (US); Sung-Kwan Kang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/164,236

(22) Filed: Oct. 18, 2018

(65) Prior Publication Data

US 2020/0126996 A1 Apr. 23, 2020

(51) Int. Cl.
*H01L 27/108* (2006.01)
*H01L 21/3213* (2006.01)
*H01L 21/033* (2006.01)

(52) U.S. Cl.
CPC .... *H01L 27/10885* (2013.01); *H01L 21/0332* (2013.01); *H01L 21/0337* (2013.01); *H01L 21/32139* (2013.01)

(58) Field of Classification Search
CPC ......... H01L 27/10885; H01L 21/32139; H01L 21/0332; H01L 21/0337
See application file for complete search history.

(56) References Cited

U.S. PATENT DOCUMENTS

| 5,100,826 A | 3/1992 | Dennison |
| 5,796,151 A | 8/1998 | Hsu et al. |
| 7,473,954 B2 | 1/2009 | Jeong et al. |
| 8,835,311 B2 | 9/2014 | Collins et al. |
| 10,043,670 B2 | 8/2018 | Ramalingam et al. |
| 2003/0068856 A1 | 4/2003 | Okumoto et al. |
| 2004/0026748 A1* | 2/2004 | Goda ................ H01L 27/11524 257/390 |

(Continued)

OTHER PUBLICATIONS

PCT International Search Report and Written Opinion in PCT/US2019/056961 dated Feb. 7, 2020, 11 pages.

*Primary Examiner* — Steven H Loke
*Assistant Examiner* — Juanita B Rhodes
(74) *Attorney, Agent, or Firm* — Servilla Whitney LLC

(57) ABSTRACT

Memory devices and methods of forming memory devices are described. The memory devices comprise a substrate with at least one film stack. The film stack comprises a polysilicon layer on the substrate; a bit line metal layer on the polysilicon layer; a cap layer on the bit line metal layer; and a hardmask on the cap layer. The memory device of some embodiments includes an optional barrier metal layer on the polysilicon layer and the bit line metal layer is on the barrier metal layer. Methods of forming electronic devices are described where one or more patterns are transferred through the films of the film stack to provide the bit line of a memory device.

20 Claims, 5 Drawing Sheets

(56) References Cited

U.S. PATENT DOCUMENTS

| | | | |
|---|---|---|---|
| 2004/0058480 A1 | 3/2004 | Nesbit et al. | |
| 2004/0120198 A1 | 6/2004 | Schwalbe et al. | |
| 2006/0166425 A1 | 7/2006 | Triyoso et al. | |
| 2007/0042601 A1* | 2/2007 | Wang | H01L 27/11521 438/689 |
| 2007/0215986 A1* | 9/2007 | Manger | H01L 21/32139 257/632 |
| 2009/0029539 A1 | 1/2009 | Sung et al. | |
| 2009/0093097 A1 | 4/2009 | Kim | |
| 2010/0297854 A1* | 11/2010 | Ramamurthy | H01L 21/0206 438/788 |
| 2012/0168704 A1 | 7/2012 | Cholet | |
| 2012/0306081 A1* | 12/2012 | Ishizaki | H01L 21/764 257/751 |
| 2015/0206756 A1* | 7/2015 | Gandikota | H01L 29/78 438/593 |
| 2017/0338282 A1* | 11/2017 | Meotto | H01L 27/2472 |

* cited by examiner

CAP LAYER FOR BIT LINE RESISTANCE REDUCTION

TECHNICAL FIELD

Embodiments of the present disclosure pertain to the field of electronic devices and electronic device manufacturing. More particularly, embodiments of the disclosure provide electronic devices including a bit line with reduced resistance and methods of forming same.

BACKGROUND

The electrically-conductive interconnect layers of modern integrated circuits are generally of very fine pitch and high density. A single, small defect in the precursor metal film which ultimately forms a metallic interconnect layer of an integrated circuit can be so positioned as to seriously damage the operational integrity of the integrated circuit.

Bit line stack deposition suffers from a number of potential issues. Surface reaction of the metal and silicon nitride hardmask can occur due to high deposition temperatures experienced in the formation of the hardmask. The bit line resistance can increase due to inter-diffusion of silicon into the bit line and metal atoms into the silicon nitride hardmask. Additionally, grain growth metals can be difficult to use due to metal surface roughness caused by high temperature silicon nitride hardmask formation.

Therefore, there is a need in the art for bit line stacks and/or methods of forming bit lines with lower resistivity.

SUMMARY

One or more embodiments of the disclosure are directed to memory devices comprising a substrate having at least one film stack thereon. The film stack comprises a polysilicon layer on the substrate, a bit line metal layer on the polysilicon layer, a cap layer on the bit line metal layer and a hardmask on the cap layer.

Additional embodiments of the disclosure are directed to methods of forming a memory device. A substrate having a conductive layer with a barrier layer thereon and a bit line metal layer on the barrier layer is provided. A cap layer is formed on the bit line metal layer at a temperature less than or equal to about 500° C. A hardmask is formed on the cap layer at a temperature greater than or equal to about 650° C. Elements of the hardmask are substantially prevented from migrating into the bit line metal layer.

Further embodiments of the disclosure are directed to methods of forming a memory device. A substrate with a film stack thereon is provided. The film stack comprises a polysilicon layer, a barrier metal layer on the polysilicon layer, a barrier layer on the barrier metal layer, a bit line metal layer on the barrier layer, a cap layer on the bit line metal layer, a hardmask on the cap layer, a carbon hardmask on the hardmask, an anti-reflective coating (ARC) on the carbon hardmask and a patterned spacer layer on the ARC. The ARC, carbon hardmask and hardmask are etched to expose the cap layer. The cap layer, bit line metal layer, barrier layer, barrier metal layer and polysilicon layer are etched to form a substrate with a plurality of dynamic random access memory (DRAM) film stacks.

BRIEF DESCRIPTION OF THE DRAWING

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

Bit line stacks and methods for forming bit line stacks with reduced resistance are provided. One or more embodiments of the disclosure advantageously address the issue of resistivity reduction in spite of the need for shrinking nodes. In some embodiments, the resistivity of the bit line is reduced by providing cleaner interfaces with existing bit line metals and by changing the bit line metal. Some embodiments of the disclosure advantageously provide one or more of flexibility in choice of the bit line metal; flexibility of temperature for silicon nitride hardmask deposition; ensure clean metal-dielectric interfaces resulting in lower resistivity; or minimizes or eliminates risk of contamination of high temperature silicon nitride hardmask deposition chamber by new bit line metals.

Some embodiments of the disclosure provide low temperature deposition methods using a cap layer to prevent roughening of the bit line metal surface when metal of choice exhibits grain growth characteristics. In some embodiments, high density non-porous films are used to act as good diffusion barriers at elevated temperatures. Some embodiments provide dielectric materials, such as silicon nitride (SiN) or silicon carbonitride (SiCN), to act as a cap film to minimize or eliminate adverse impact on the RC time constant by acting as a good diffusions barrier for bit line metal and SiN hardmask. The RC time constant is the time associated with charging a capacitor through a resistor to a percentage of full charge or to discharge the capacitor to a fraction of the initial voltage. The RC time constant is equal to the product of the circuit resistance and the circuit capacitance. Some embodiments of the disclosure advantageously provide deposition processes at low temperatures (e.g., <500° C.). Some embodiments provide compatible deposition processes with underlying bit line metals to minimize or eliminate surface reactions during film deposition.

One or more embodiments of the disclosure generally provide structures which include one or more low-resistivity features formed from a thin film refractory metal (e.g., tungsten) as may be implemented in bit line structures and/or gate stacks. Some embodiments include methods for forming bit line stacks. By way of example, a bit line stack structure formed in accordance with embodiments of the present disclosure may be a memory type semiconductor device, such as a DRAM type integrated circuit.

Figure 1:
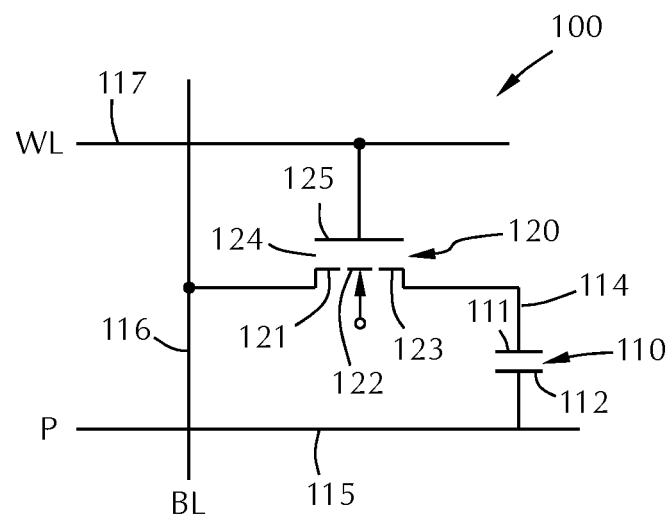
FIG. 1 illustrates a circuit diagram of a dynamic memory cell in a DRAM memory having improved properties in accordance with one or more embodiments of the present disclosure.

FIG. 1 illustrates a schematic circuit diagram of a one transistor one capacitor cell 100 such as may be used in DRAM memories. The memory cell depicted in FIG. 1 comprises a storage capacitor 110 and a selection transistor 120. The selection transistor 120 is formed as a field effect transistor and has a first source/drain electrode 121 and a second source/drain electrode 123 between which an active region 122 is arranged. Above the active region 122 are the gate insulating layer or dielectric layer 124, typically a thermally grown oxide, and gate electrode/metal 125 (called word line in memory devices), together which act like a plate capacitor and can influence the charge density in the active region 122 in order to form or block a current conducting channel between the first source/drain electrode 121 and the second source/drain electrode 123.

The second source/drain electrode 123 of the selection transistor 120 is connected to a first electrode 111 of the storage capacitor 110 via a metal line 114. A second electrode 112 of the storage capacitor 110 is in turn connected to a capacitor plate which may be common to storage capacitors of the DRAM memory cell arrangement. The second electrode 112 of storage capacitor 110 can be connected to electrical ground via metal line 115. The first source/drain electrode 121 of the selection transistor 120 is furthermore connected to a bit line 116 in order that the information stored in storage capacitor 110 in the form of charges can be written in and read out. The write in or read out operation is controlled via a word line 117 or gate electrode 125 of the selection transistor 120 and bit line 116 which is connected to the first source/drain electrode 121. The write in or read out operation occurs by applying a voltage to produce a current conducting channel in the active region 122 between the first source/drain electrode 121 and the second source/drain electrode 123.

Figure 2:
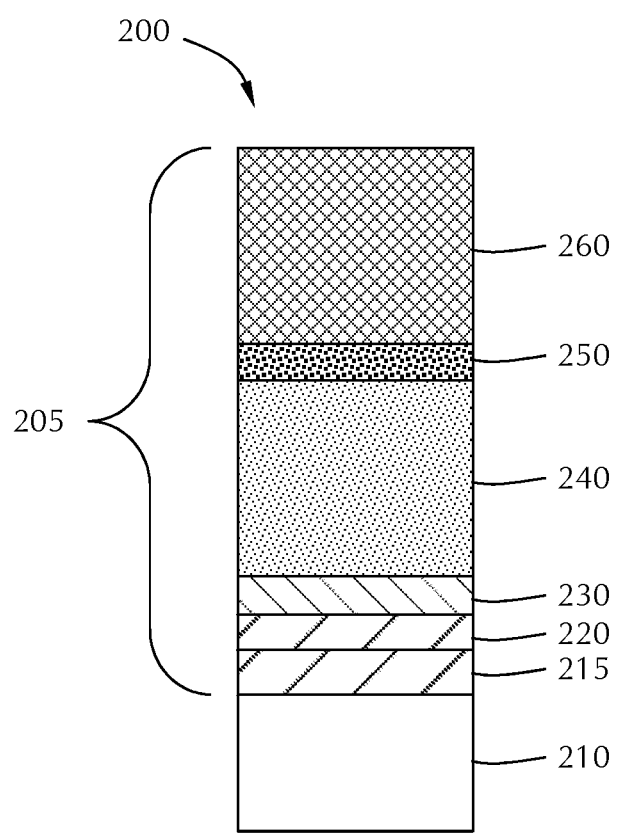
FIG. 2 illustrates a schematic representation of a film stack according to one or more embodiments.
Figure 3:
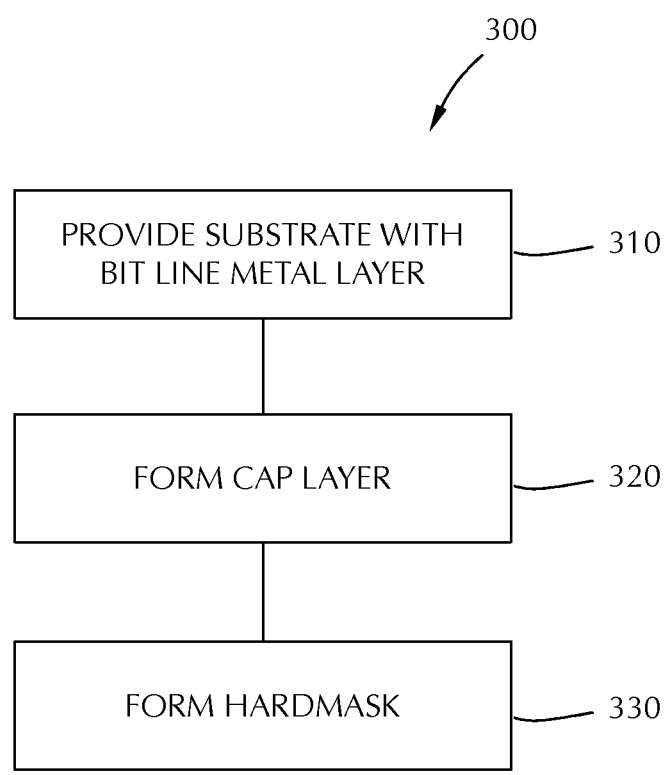
FIG. 3 illustrates a flowchart method for forming a film stack according to one or more embodiments.

FIG. 2 illustrates a portion of a memory device 200 in accordance with one or more embodiment of the disclosure. FIG. 3 illustrates an exemplary processing method 300 for forming the memory device 200 illustrated in FIG. 2. The skilled artisan will recognize that the film stacks illustrated in the drawings is an exemplary portion (the bit line portion) of a memory device.

Referring to FIGS. 2 and 3, formation of the memory device 200 comprises, at operation 310, providing a substrate 210 upon which a film stack 205 can be formed. As used in this specification and the appended claims, the term "provided" means that the substrate is made available for processing (e.g., positioned in a processing chamber).

As used in this specification and the appended claims, the term "substrate" refers to a surface, or portion of a surface, upon which a process acts. It will also be understood by those skilled in the art that reference to a substrate can refer to only a portion of the substrate, unless the context clearly indicates otherwise. Additionally, reference to depositing on a substrate can mean both a bare substrate and a substrate with one or more films or features deposited or formed thereon.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

In some embodiments, the substrate 210 provided comprises a film stack 205 comprising a polysilicon layer 215 and a bit line metal layer 240. In some embodiments, the substrate 210 provided comprises a polysilicon layer 215 and the bit line metal layer 240 is formed as part of method 300.

In some embodiments, the substrate 210 comprises an oxide layer (not shown) on a silicon wafer. In some embodiments, the oxide layer is a native oxide formed on the silicon wafer. In some embodiments, the oxide layer is intentionally formed on the silicon wafer and has a thickness greater than the thickness of a native oxide film. The oxide layer can be formed by any suitable technique known to the skilled artisan including, but not limited to, thermal oxidation, plasma oxidation and exposure to atmospheric conditions.

In some embodiments, the substrate 210 provided in operation 310 further comprises a barrier metal layer 220 (also referred to as a conductive layer) on the polysilicon layer 215. The barrier metal layer 220 can be any suitable conductive material. In some embodiments, the barrier metal layer 220 comprises one or more of titanium (Ti), tantalum (Ta), titanium silicide (TiSi) or tantalum silicide (TaSi). In some embodiments, the barrier metal layer 220 comprises titanium. In some embodiments, the barrier metal layer 220 consists essentially of titanium. In some embodiments, the barrier metal layer 220 comprises or consists essentially of tantalum. In some embodiments, the barrier metal layer 220 comprises or consists essentially of titanium silicide. In some embodiments, the barrier metal layer 220 comprises or consists essentially of tantalum silicide. As used in this manner, the term "consists essentially of" means that the subject film comprises greater than or equal to about 95%, 98%, 99% or 99.9% of the stated element or composition, on an atomic basis. For example, a barrier metal layer 220 consisting essentially of titanium has a film that is greater than or equal to about 95%, 98%, 99% or 99.5% titanium as deposited.

In some embodiments, the substrate 210 provided in operation 310 further comprises a barrier layer 230 on the conductive layer (barrier metal layer 220). The barrier layer 230 can be formed between the barrier metal layer 220 and the bit line metal layer 240. In some embodiments, the method 300 includes an operation before operation 310 where the bit line metal layer 240 is formed on the barrier layer 230. The barrier layer 230 can be any suitable barrier layer material. In some embodiments, the barrier layer 230 comprises one or more of a nitride or an oxide of the barrier metal layer 220. In some embodiments, the barrier layer 230 consists essentially of a nitride of the barrier metal layer 220. For example, a barrier layer 230 consisting essentially of titanium nitride means that the sum of the titanium and nitrogen atoms in the film make up greater than or equal to about 95%, 98%, 99% or 99.5% of the barrier layer 230 on an atomic basis as deposited.

In some embodiments, the barrier metal layer 220 comprises titanium (Ti) and the barrier layer 230 comprises titanium nitride (TiN). In some embodiments, the barrier metal layer 220 consists essentially of titanium and the barrier layer 230 consists essentially of titanium nitride. In one or more embodiments, the barrier metal layer 220 comprises a metal selected from one or more of cobalt (Co), copper (Cu), nickel (Ni), ruthenium (Ru), manganese (Mn), silver (Ag), gold (Au), platinum (Pt), iron (Fe), molybdenum (Mo), rhodium (Rh), titanium (Ti), tantalum (Ta), silicon (Si), or tungsten (W). In one or more specific embodiments, the barrier metal layer 220 (conductive material) comprises one or more of titanium (Ti), copper (Cu), cobalt (Co), tungsten (W), or ruthenium (Ru). In some embodiments, the barrier layer 230 comprises a nitride, oxynitride, carbonitride, or oxycarbonitride of the metal in barrier metal layer 220. In some embodiments, the barrier metal layer 220 comprises (or consists essentially of) tantalum or tantalum silicide and the barrier layer 230 comprises (or consists essentially of) tantalum nitride. In some embodiments, the barrier metal layer 220 comprises (or consists essentially of) titanium or titanium silicide and the barrier layer 230 comprises (or consists essentially of) titanium nitride.

In some embodiments, the bit line metal layer 240 is included in the substrate provided in operation 310 of method 300. The bit line metal layer 240 can be deposited by any suitable technique known to the skilled artisan. In some embodiments, the bit line metal layer 240 comprises one or more of tungsten (W), ruthenium (Ru), iridium (Ir), platinum (Pt), rhodium (Rh) or molybdenum (Mo). In some specific embodiments, the bit line metal layer 240 comprises or consists essentially of one or more of ruthenium or tungsten.

The thickness of the bit line metal layer 240 can be varied. In some embodiments, the bit line metal layer 240 has a thickness in a range of about 100 Å to about 300 Å, or in the range of about 120 Å to about 250 Å, or in the range of about 140 Å to about 200 Å, or in the range of about 160 Å to about 180 Å.

The bit line metal layer 240 can be deposited by any suitable technique known to the skilled artisan. In some embodiments, the bit line metal layer 240 is deposited by one or more of chemical vapor deposition, atomic layer deposition or physical vapor deposition.

At operation 320, a cap layer 250 is formed on the bit line metal layer 240. The cap layer 250 of some embodiments is deposited at a lower temperature than would typically be used for formation of a subsequent hardmask 260 layer. Without being bound by any particular theory of operation, it is believed that the lower deposition temperature minimizes diffusion of the cap layer 250 elements into the bit line metal layer 240. In some embodiments, it is believed that the low temperature deposition of the cap layer 250 minimizes grain growth at the bit line metal layer 240 interface and minimizes the effect of grain size and roughness on the resistivity of the resulting bit line metal layer 240.

The cap layer 250 can be deposited by any suitable technique known to the skilled artisan. In some embodiments, the cap layer 250 is deposited by one or more of chemical vapor deposition or atomic layer deposition.

The cap layer 250 of some embodiments comprises the same compound as a subsequent hardmask 260. In some embodiments, the cap layer 250 comprises one or more of silicon nitride, silicon carbonitride or silicon carbide. In some embodiments, the cap layer 250 consists essentially of silicon nitride. In some embodiments, the cap layer 250 consists essentially of silicon carbonitride. In some embodiments, the cap layer 250 consists essentially of silicon carbide.

The thickness of the cap layer 250 can be varied to minimize the impact of high temperature formation of a hardmask 260. In some embodiments, the cap layer 250 has a thickness in the range of about 30 Å to about 50 Å.

The deposition temperature of the cap layer 250 can be controlled to, for example, preserve the thermal budget of the device being formed. In some embodiments, the cap layer 250 is formed at a temperature less than or equal to about 500° C., or about 450° C., or about 400° C., or about 350° C., or about 300° C. In some embodiments, the cap layer 250 is formed at a temperature in the range of about 350° C. to about 550° C., or in the range of about 400° C. to about 500° C.

At operation 330, a hardmask 260 is formed on the cap layer 250. The hardmask 260 of some embodiments is formed in a furnace at a temperature greater than about 600° C., about 650° C., about 700° C. or about 750° C.

In some embodiments, the hardmask 260 comprises the same composition as the cap layer 250. In some embodiments, the cap layer 250 and the hardmask 260 comprise or consist essentially of silicon nitride, silicon oxide, silicon carbide or silicon carbonitride. In some embodiments, the hardmask 260 has a different density than the cap layer 250. In some embodiments, the hardmask 260 has a different porosity than the cap layer 250. In some embodiments, the hardmask 260 has a different deposition temperature than the cap layer 250.

In some embodiments, the bit line metal layer 240 comprises or consists essentially of tungsten and one or more of the cap layer 250 or hardmask 260 comprises or consists essentially of silicon nitride. In some embodiments, the bit line metal layer 240 comprises or consists essentially of ruthenium and one or more of the cap layer 250 or hardmask 260 comprises or consists essentially of silicon oxide or silicon nitride.

In some embodiments, the elements of the hardmask 260 are substantially prevented from migrating into the bit line metal layer 240. For example, if the hardmask 260 comprises silicon and nitrogen atoms, silicon or nitrogen atoms are substantially prevented from migrating into the bit line metal layer 240. As used in this manner, the term "substantially prevented" means that less than or equal to about 10% or 5% of the hardmask 260 elements migrate into the bit line metal layer 240 through the cap layer 250.

Figure 4:
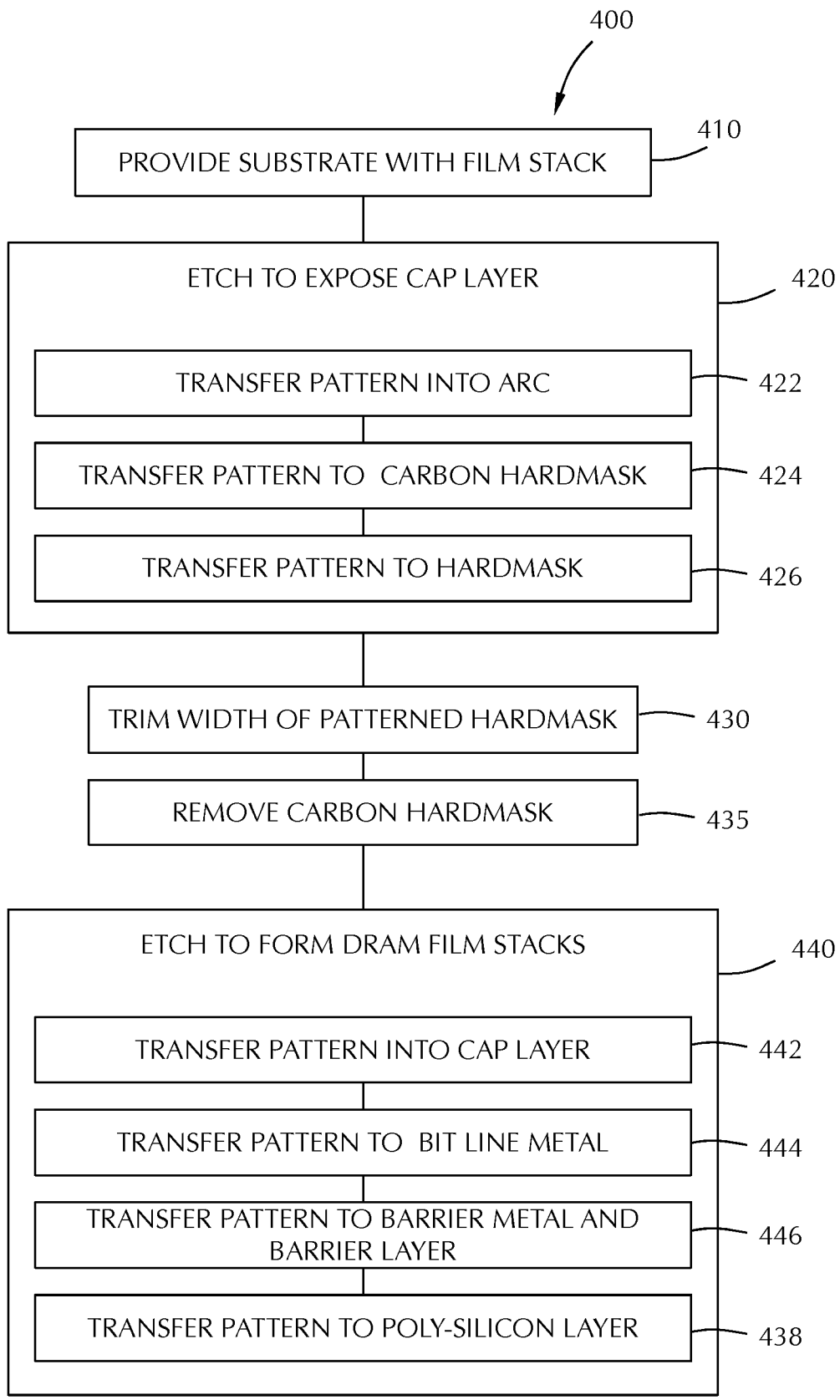
FIG. 4 illustrates a flowchart method for forming an electronic device according to one or more embodiments.

Additional embodiments of the disclosure are directed to methods of forming a memory device. The skilled artisan will recognize that the methods described can form a portion of a memory device (e.g., a bit line) which can be part of a complete memory device. FIG. 4 illustrates a process flow for an exemplary method 400 for forming a memory device. FIGS. 5A through 5J show schematic representations of the various layers and films during formation of the electronic device 500 (see FIG. 5J) following a method 400 in accordance with FIG. 4. The skilled artisan will recognize that the method 400 can start with various configurations of the substrate and films/layers thereon. For example, the method 400 could start with the configuration illustrated in any of FIGS. 5B through 5I, concluding at the electronic device 500 illustrated in FIG. 5J. The films/layers described can be the same as the films/layers described with respect to FIG. 2, and the reference numerals used to describe the films/layers are consistent with those of the embodiment of FIG. 2.

Figure 5A:
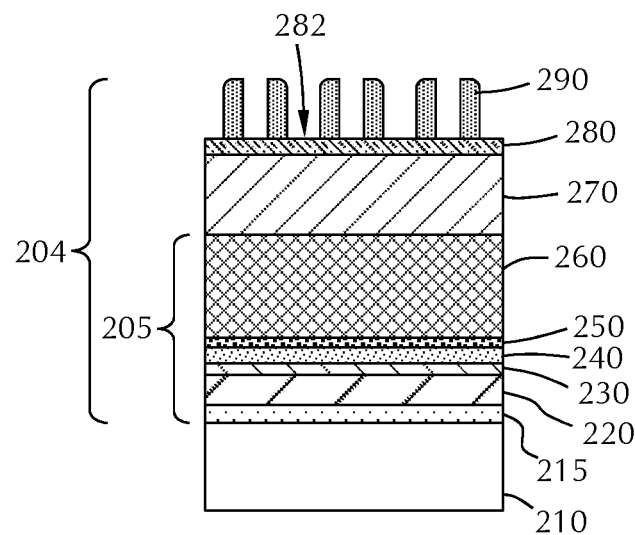
FIGS. 5A through 5J show a schematic representation of a process for forming an electronic device in accordance with one or more embodiments of the disclosure.

At operation 410, a substrate 210 is provided for processing. The substrate 210 has a film stack 204 formed thereon, as shown in FIG. 5A. The film stack 204 comprises the film stack 205 illustrated in FIG. 2 with additional layers/films formed thereon, as shown in FIG. 5A. In some embodiments, the film stack 204 comprises a polysilicon layer 215 on the substrate 210, or directly on the substrate 210. As used in this manner, the term "directly on" means that the subject films are formed without intervening layers or films. The skilled artisan will recognize that any of the films/layers described as being "on" another film/layer can be "directly on" or can have intervening layers.

An optional barrier metal layer 220 is on the polysilicon layer 215, or directly on the polysilicon layer 215. In some embodiments, there is no barrier metal layer 220 in the film stack 204. An optional barrier layer 230 can be on the optional barrier metal layer 220, directly on the optional barrier metal layer 220 or directly on the polysilicon layer 215. A bit line metal layer 240 is on the optional barrier layer 230 or directly on the optional barrier layer 230, or directly on the barrier metal layer 220, or directly on the polysilicon layer 215. A cap layer 250 is on the bit line metal layer 240 or directly on the bit line metal layer 240. A hard mask 260 is on the cap layer 250 or directly on the cap layer 250.

The film stack 204 of some embodiments further comprises one or more of a carbon hardmask 270, anti-reflective coating (ARC) 280 or spacer layer 290. In some embodiments, the carbon hardmask 270 is formed on or directly on the hardmask 260. The carbon hardmask 270 can be any suitable carbon containing material that can be used as a hardmask for device patterning. In some embodiments, the carbon hardmask 270 comprises a high-density carbon film.

In some embodiments, the carbon hardmask 270 comprises a diamond-like carbon material. For diamond-like carbon materials, the bulk properties sought may include, without limitation, high density and modulus (e.g., higher sp3 content, more diamond-like) and low stress (e.g., <−500 MPa). Some embodiments of diamond-like carbon films have one or more of high density (e.g., >1.8 g/cc), high modulus (e.g., >150 GPa) and/or low stress (e.g., <−500 MPa). In some embodiments, the carbon hardmask 270 has low stress and high sp3 carbon content.

The carbon hardmask 270 can be formed by any suitable process known to the skilled artisan. The carbon hardmask 270 can be formed at any suitable temperature depending on, for example, the thermal budget of the device being formed, the process used for formation and/or the reactive species used for formation of the film.

In some embodiments, an anti-reflective coating (ARC) 280 is formed on or directly on the carbon hardmask 270. In some embodiments, the ARC 280 is formed directly on the hardmask 260 without an intervening carbon hardmask 270. The anti-reflective coating 280 of some embodiments comprises one or more of a silicon ARC (SiARC), a bottom ARC (BARC) or dielectric ARC (DARC). In some embodiments, the ARC 280 and carbon hardmask 270 are reversed so that the ARC 280 is directly on the hardmask 260 and the carbon hardmask 270 is directly on the ARC 280.

The ARC 280 can be formed by any suitable process known to the skilled artisan. In some embodiments, the ARC 280 is deposited using one of deposition techniques, such as but not limited to a chemical vapor deposition ("CVD"), a physical vapor deposition ("PVD"), molecular beam epitaxy ("MBE"), metalorganic chemical vapor deposition ("MOCVD"), atomic layer deposition ("ALD"), spin-on, or other insulating deposition techniques known to one of ordinary skill in the art of microelectronic device manufacturing.

A patterned spacer layer 290 is on or directly on the ARC 280. In some embodiments, the patterned spacer layer 290 is directly on the carbon hardmask 270 with or without an ARC 280 below the carbon hardmask 270. The pattern of the patterned spacer layer 290 can be formed by any suitable patterning technique known the skilled artisan including, but not limited to, lithography. The patterned spacer layer 290 has a pattern that exposes portions of the top surface 282 of the ARC 280, or the top surface 272 of the carbon hardmask 270.

Figure 5B:
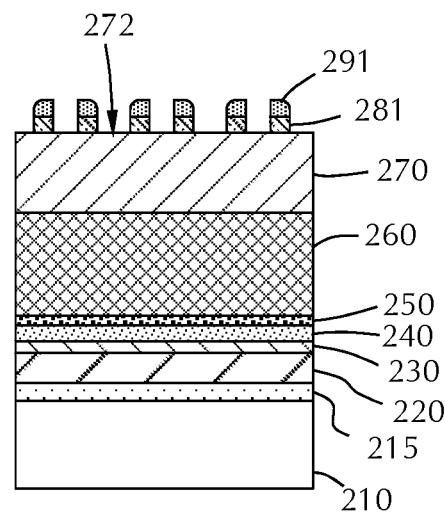
Figure 5C:
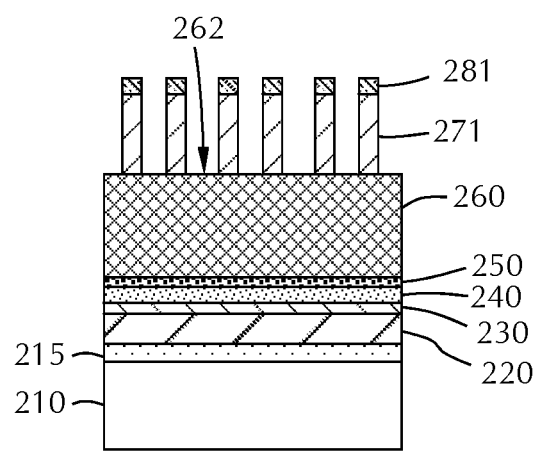
Figure 5D:
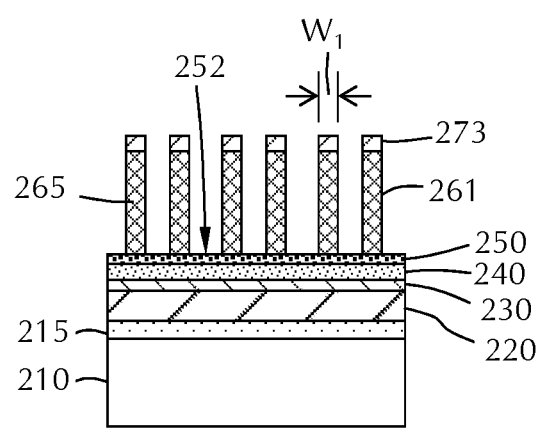

At operation 420, the film stack 204 is etched to expose the cap layer 250, as shown in FIG. 5D. Operation 420 can include any number of processes sufficient to etch the ARC 280, the carbon hardmask 270 and the hardmask 260 to expose the cap layer 250. The skilled artisan will recognize that the process of FIG. 4 is merely representative of one possible process and series of operations.

In the illustrated embodiment, at operation 422, the pattern of the patterned spacer layer 290 is transferred to the ARC 280 to form a patterned ARC 281, as shown in FIG. 5B. The pattern can be transferred to the ARC 280 by any suitable technique known to the skilled artisan including, but not limited to, isotropic etch. The pattern of the patterned ARC 281 is essentially the same as the pattern of the patterned spacer layer 290 and exposes the top surface 272 of the carbon hardmask 270. As used in this manner, the term "essentially the same" means that the transferred pattern is aligned with the source pattern and allows for slight imperfections to be transferred, as will be understood by the skilled artisan. Reference to the patterns being the "same" as the previous pattern also recognizes that small variations and imperfections are expected and within the scope of the disclosure. In some embodiments, the ARC 280 is etched through patterned spacer layer 290 to form the patterned ARC 281.

As shown in FIG. 5B, the patterned spacer layer 290 is reduced in height (thickness) to form reduced patterned spacer layer 291. The reduction in thickness of the patterned spacer layer can occur at the same time as the pattern transfer, or in a separate process. In some embodiments, the patterned spacer layer 290 is etched at the same time as the ARC 280 to form the reduced patterned spacer layer 291 and patterned ARC 281. In some embodiments, the patterned spacer layer 290 is completely removed during the pattern transfer process.

In operation 424, as shown in FIG. 5C, the pattern of the patterned ARC 281 is transferred into the carbon hardmask 270 to form a patterned carbon hardmask 271. The pattern of the patterned carbon hardmask 271 is essentially the same as the pattern of the pattern ARC 281 and exposes a top surface 262 of the hardmask 260. The pattern can be transferred to the carbon hardmask 270 by any suitable technique known to the skilled artisan including, but not limited to, isotropic etch, selective etch or anisotropic etch.

In the illustrated process, the reduced patterned spacer layer 291 is removed with the pattern transfer into the carbon hardmask 270. The removal of the reduced patterned spacer layer 291 can occur in the same process or different process than the pattern transfer.

In operation 426, as shown in FIG. 5D, the pattern of the patterned carbon hardmask 271 is transferred into the hardmask 260 to form a patterned hardmask 261 and expose the top surface 252 of the cap layer 250. The pattern can be transferred from the patterned carbon hardmask 271 to the patterned hardmask 261 by any suitable technique known to the skilled artisan including, but not limited to, isotropic etch, selective etch or anisotropic etch.

In the embodiment illustrated in FIG. 5D, the thickness of the patterned carbon hardmask 271 is reduced to form a reduced patterned carbon hardmask 273. In some embodiments, reducing the thickness of the patterned carbon hardmask 271 occurs at the same time as transferring the pattern to the hardmask 270. In some embodiments, reducing the thickness of the patterned carbon hardmask 271 occurs in a separate process than the pattern transfer.

Figure 5E:
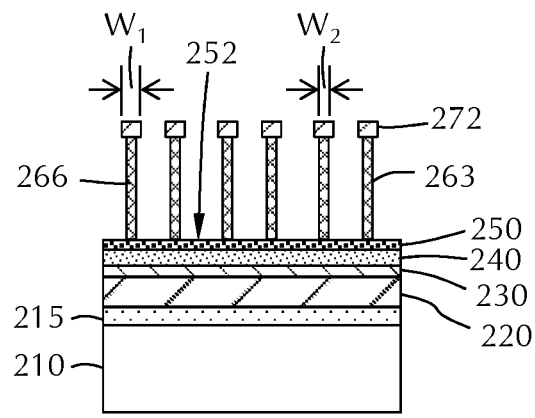

At operation 430, which is optional, the width $W_1$ of the individual mandrels 265 of the patterned hardmask 261 is reduced to a smaller width $W_2$. The trimmed mandrels 266, as shown in FIG. 5E, have a smaller width $W_2$ than the width $W_1$ of the reduced patterned carbon hardmask 272. Trimming the width of the mandrels 265 can be done by any suitable trimming process known to the skilled artisan including, but not limited to, plasma exposure.

Figure 5F:
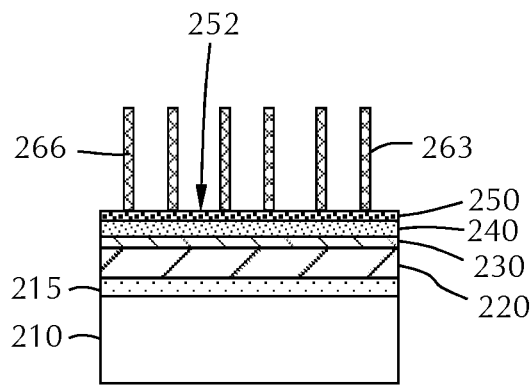

At operation 435, as shown in FIG. 5F, the reduced patterned carbon hardmask 272 is removed from the trimmed patterned hardmask 263 or from the patterned hardmask 261 (if the trimming operation 430 is omitted). Removal of the reduced patterned carbon hardmask 272 can be done by any suitable process known to the skilled artisan including, but not limited to, selective etching.

Figure 5G:
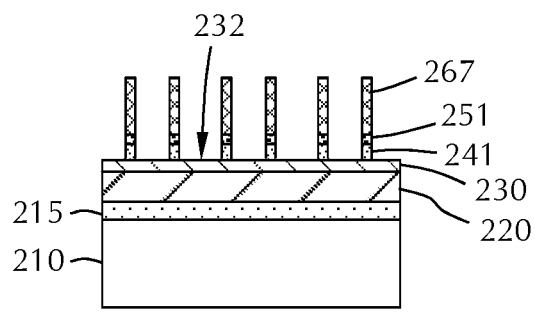
Figure 5H:
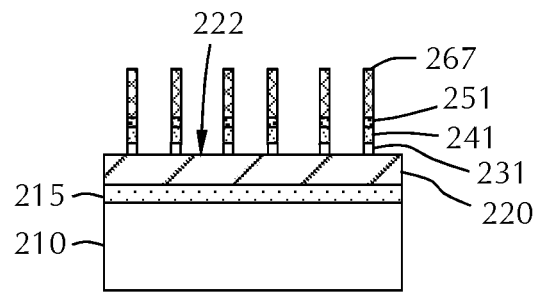
Figure 5I:
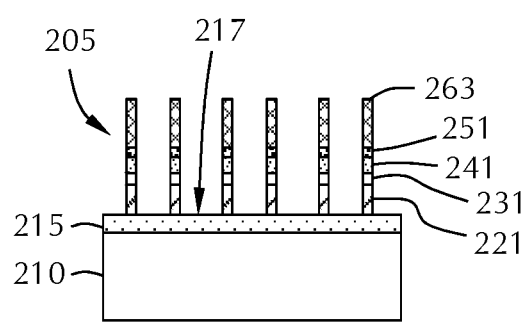
Figure 5J:
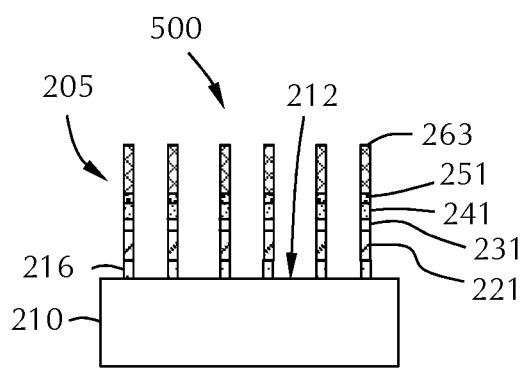

At operation 440, a substrate 210 with a plurality of DRAM film stacks 205 are formed, as shown in FIG. 5J. To arrive at the substrate 210 with the plurality of DRAM film stacks 205, the cap layer 250, bit line metal layer 240, barrier layer 230, barrier metal layer 220 and polysilicon layer 215 are etched.

At operation 442, as shown in FIG. 5G, the pattern of trimmed patterned hardmask 263 is transferred to the cap layer 250 and bit line metal layer 240 to form a patterned cap layer 251 and patterned bit line metal layer 241, respectively, and expose the top surface 232 of the barrier layer 230. If the mandrel 265 in FIG. 5D is not trimmed, then the pattern of the patterned hardmask 261 is transferred to the cap layer 250 and bit line metal layer 240. The difference in processes being the width of the pattern mandrels.

The illustrated embodiment shows the pattern transfer to the cap layer 250 and bit line metal layer 240 at the same time. The method 400 shows the pattern transfers split into operations 442 and 444. In some embodiments, as in operation 442, the pattern is transferred to the cap layer 250 to form a patterned cap layer 251 and expose a top surface (not shown) of the bit line metal layer 240. The pattern of the patterned cap layer 251 can then be transferred, as in operation 444, to the bit line metal layer 240 to form the patterned bit line metal layer 241.

In the embodiment illustrated in FIG. 5G, the thickness of the patterned hardmask 263 is reduced to form a reduced patterned hardmask 267. In some embodiments, reducing the thickness of the patterned hardmask 263 occurs at the same time as transferring the pattern to the cap layer 250 and/or bit line metal layer 240. In some embodiments, reducing the thickness of the patterned hardmask 263 occurs in a separate process than the pattern transfer to either the cap layer 250 or bit line metal layer 240.

At operation 446, the pattern of the patterned bit line metal layer 241 is transferred to the barrier layer 230 and to barrier metal layer 220 to form a patterned barrier layer 231 and patterned metal layer 221. The pattern transfer can be to both the barrier layer 230 and barrier metal layer 220 at the same time or in separate processes. The flow chart method 400 of FIG. 4 shows a single operation 446 to transfer the pattern to both the barrier layer 230 and the barrier metal layer 220. The illustrated schematics show separate processes. In FIG. 5H, the pattern is transferred to the barrier layer 231 to form patterned barrier layer 231 and expose the top surface 222 of the barrier metal layer 220. In FIG. 5I, the pattern is transferred to the barrier metal layer 220 to form patterned metal layer 221 and expose the top surface 217 of the polysilicon layer 215. Transferring the pattern to the barrier layer 230 and barrier metal layer 220 can be done by any suitable technique known to the skilled artisan including, but not limited to, selective etching.

In operation 448, as shown in FIG. 5J, the pattern of the patterned metal layer 221 is transferred to the polysilicon layer 215 to form a patterned polysilicon layer 216, and expose the top surface 212 of the substrate 210. The resultant electronic device 500 has a plurality of film stacks 205 similar to that illustrated in FIG. 2. In embodiments where some of the layers are omitted, the plurality of film stacks will also omit the same layers. Transferring the pattern into the polysilicon layer can be done by any suitable technique including, but not limited to, selective etching.

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of forming a memory device, the method comprising:
providing a substrate having a film stack thereon, the film stack comprising a polysilicon layer, a barrier metal layer on the polysilicon layer, a barrier layer on the barrier metal layer, a bit line metal layer on the barrier layer, a cap layer on the bit line metal layer, a hardmask on the cap layer, a carbon hardmask on the hardmask, an anti-reflective coating (ARC) on the carbon hardmask and a patterned spacer layer on the ARC;
etching the ARC, carbon hardmask and hardmask to expose the cap layer by transferring the pattern of the patterned spacer layer into the ARC, reducing a thickness of the patterned spacer layer and forming a patterned ARC, transferring the pattern of the patterned ARC into the carbon hardmask, removing the patterned spacer layer and forming a patterned carbon hardmask, transferring a pattern of the patterned carbon hardmask into the hardmask;
removing the patterned ARC and reducing a thickness of the patterned carbon hardmask;
trimming a width of the patterned hardmask;
removing the carbon hardmask from the trimmed patterned hardmask; and
transferring a pattern of the trimmed pattern hardmask into the cap layer to form a patterned cap layer;
etching the bit line metal layer, barrier layer, barrier metal layer and polysilicon layer to form the substrate with a plurality of dynamic random access memory (DRAM) film stacks.

2. The method of claim 1, wherein etching the bit line metal layer, barrier layer, barrier metal layer and polysilicon layer to form the substrate with the plurality of dynamic random access memory (DRAM) film stacks comprises:
transferring the pattern of the patterned cap layer into the bit line metal layer to form a patterned bit line metal layer;
transferring the pattern of the patterned bit line metal layer into the barrier layer to form a patterned barrier layer; and
transferring the pattern of the patterned barrier layer into the barrier metal layer to form a patterned barrier metal layer; and
transferring the pattern of the patterned barrier metal layer into the polysilicon layer to form a patterned polysilicon layer on the substrate.

3. The method of claim 1, wherein:
the bit line metal layer comprises one or more of a group consisting of tungsten (W), ruthenium (Ru), iridium (Ir) and molybdenum (Mo), and has a thickness in a range of about 100 Å to about 300 Å;
the cap layer comprises silicon nitride (SiN) or silicon carbonitride (SiCN) with a thickness in a range of about 30 Å to about 50 Å; and
the hardmask comprises silicon nitride (SiN).

4. The method of claim 1, wherein the barrier layer comprises one of more of a group consisting of a nitride and an oxide of the barrier metal layer.

5. The method of claim 1, wherein the barrier metal layer comprises one or more of a group consisting of cobalt (Co), copper (Cu), nickel (Ni), ruthenium (Ru), manganese (Mn), silver (Ag), gold (Au), platinum (Pt), iron (Fe), molybdenum (Mo), rhodium (Rh), titanium (Ti), tantalum (Ta), silicon (Si) and tungsten (W).

6. The method of claim 1, wherein the bit line metal layer comprises one or more of a group consisting of tungsten (W), ruthenium (Ru), iridium (Ir), molybdenum (Mo), platinum (Pt) and rhodium (Rh).

7. The method of claim 6, wherein the bit line metal layer has a thickness in a range of about 100 Å to about 300 Å.

8. The method of claim 1 wherein the barrier metal layer comprises one or more of a group consisting of titanium (Ti) and titanium silicide (TiSi) and the barrier layer comprises titanium nitride (TiN).

9. The method of claim 1, wherein the barrier metal layer comprises one or more of a group consisting of tantalum (Ta) and tantalum silicide (TaS) and the barrier layer comprises tantalum nitride (TaN).

10. The method of claim 1, wherein the cap layer comprises silicon nitride (SiN), silicon carbonitride (SiCN) or silicon carbide (SiC).

11. The method of claim 10, wherein the cap layer is deposited by a chemical vapor deposition (CVD) or atomic layer deposition (ALD) process at a temperature less than or equal to about 500° C.

12. The method of claim 1, wherein the cap layer has a thickness in the range of about 30 Å to about 50 Å.

13. The method of claim 1, wherein the hardmask comprises silicon nitride (SiN).

14. The method of claim 13, wherein the hardmask is formed on the cap layer at a temperature greater than or equal to about 650° C.

15. The method of claim 1, wherein the elements of the hardmask are substantially prevented from migrating into the bit line metal layer.

16. The method of claim 1 wherein the cap layer comprises silicon nitride (SiN) having a different density and/or porosity and/or deposition temperature than the hardmask comprising silicon nitride (SiN).

17. A method of forming a memory device, the method comprising:
transferring a pattern of a patterned spacer layer into an anti-reflective coating (ARC) of a film stack on a substrate, the film stack comprising a polysilicon layer, a barrier metal layer on the polysilicon layer, a barrier layer on the barrier metal layer, a bit line metal layer on the barrier layer, a cap layer on the bit line metal layer, a hardmask on the cap layer, a carbon hardmask on the hardmask, the anti-reflective coating (ARC) on the carbon hardmask and the patterned spacer layer on the ARC;
reducing a thickness of the patterned spacer layer and transferring the pattern of the patterned spacer layer to the ARC to form a patterned ARC;
transferring a pattern of the patterned ARC into the carbon hardmask;
removing the patterned spacer layer and forming a patterned carbon hardmask;
transferring a pattern of the patterned carbon hardmask into the hardmask;
removing the patterned ARC and reducing a thickness of the patterned carbon hardmask;

trimming a width of the patterned hardmask;
removing the carbon hardmask from the patterned hardmask; and
transferring a pattern of the trimmed pattern hardmask into the cap layer to form a patterned cap layer;
etching the bit line metal layer, barrier layer, barrier metal layer and polysilicon layer to form a substrate with a plurality of dynamic random access memory (DRAM) film stacks.

18. The method of claim 17, wherein etching the bit line metal layer, barrier layer, barrier metal layer and polysilicon layer to form the substrate with a plurality of dynamic random access memory (DRAM) film stacks comprises:
transferring the pattern of the patterned cap layer into the bit line metal layer to form a patterned bit line metal layer;
transferring the pattern of the patterned bit line metal layer into the barrier layer to form a patterned barrier layer; and
transferring the pattern of the patterned barrier layer into the barrier metal layer to form a patterned barrier metal layer; and
transferring the pattern of the patterned barrier metal layer into the polysilicon layer to form a patterned polysilicon layer on the substrate.

19. The method of claim 17, wherein:

the bit line metal layer comprises one or more of a group consisting of tungsten (W), ruthenium (Ru), iridium (Ir) and molybdenum (Mo), and has a thickness in a range of about 100 Å to about 300 Å;

the cap layer comprises silicon nitride (SiN) or silicon carbonitride (SiCN) with a thickness in a range of about 30 Å to about 50 Å; and the hardmask comprises silicon nitride (SiN).

20. The method of claim 17, wherein the barrier metal layer comprises one or more of a group consisting of titanium (Ti), tantalum (Ta), titanium silicide (TiSi) or tantalum silicide (TaSi) and the barrier layer comprises one or more of a group consisting of titanium nitride (TiN) and tantalum nitride (TaN).

* * * * *

UNITED STATES PATENT AND TRADEMARK OFFICE
CERTIFICATE OF CORRECTION

PATENT NO. : 10,700,072 B2
APPLICATION NO. : 16/164236
DATED : June 30, 2020
INVENTOR(S) : Priyadarshi Panda et al.

Page 1 of 1

It is certified that error appears in the above-identified patent and that said Letters Patent is hereby corrected as shown below:

In the Claims

In Claim 18, Line 3, replace "a" between "with" and "plurality" with "the".

Signed and Sealed this
Eighth Day of September, 2020

Andrei Iancu
*Director of the United States Patent and Trademark Office*